US009269316B2

(12) United States Patent
Yang et al.

(10) Patent No.: US 9,269,316 B2
(45) Date of Patent: Feb. 23, 2016

(54) SHIFT REGISTER, GATE DRIVING DEVICE AND LIQUID CRYSTAL DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Tong Yang, Beijing (CN); Rui Ma, Beijing (CN); Ming Hu, Beijing (CN)

(73) Assignees: BOE Technology Group Co., Ltd., Beijing (CN); HEFEI BOE Optoelectronics Technology Co., Ltd., Hefei, Anhui (CN)

( * ) Notice: Subject to any disclaimer, the term of this patent is extended or adjusted under 35 U.S.C. 154(b) by 93 days.

(21) Appl. No.: 14/352,796

(22) PCT Filed: Jun. 17, 2013

(86) PCT No.: PCT/CN2013/077334
§ 371 (c)(1),
(2) Date: Apr. 18, 2014

(87) PCT Pub. No.: WO2014/169513
PCT Pub. Date: Oct. 23, 2014

(65) Prior Publication Data
US 2015/0339997 A1    Nov. 26, 2015

(30) Foreign Application Priority Data

Apr. 16, 2013    (CN) .......................... 2013 1 0132519

(51) Int. Cl.
*G09G 5/00*         (2006.01)
*G09G 3/36*         (2006.01)

(52) U.S. Cl.
CPC ...... *G09G 3/3659* (2013.01); *G09G 2310/0286* (2013.01); *G09G 2310/08* (2013.01); *G09G 2320/043* (2013.01); *G09G 2320/045* (2013.01); *G09G 2330/022* (2013.01)

(58) Field of Classification Search
CPC combination set(s) only.
See application file for complete search history.

(56) References Cited

U.S. PATENT DOCUMENTS

| | | | | |
|---|---|---|---|---|
| 2012/0293467 | A1* | 11/2012 | Lee ...................... | G09G 3/3677 345/204 |
| 2014/0118237 | A1* | 5/2014 | Wang .................... | G11C 19/28 345/100 |
| 2015/0248940 | A1* | 9/2015 | Yang .................... | G09G 3/3677 377/64 |

OTHER PUBLICATIONS

Oct. 20, 2015—International Preliminary Report on Patentability Appn PCTCN2013077334.

*Primary Examiner* — Van Chow
(74) *Attorney, Agent, or Firm* — Banner & Witcoff, Ltd.

(57) ABSTRACT

A shift register, a gate driving device and a liquid crystal display device aim to solve the problem that the lifespan of the gate driving device is shortened since some transistors in an existing shift register are in a turn-on state all the time during a non-operational period to reduce noise on a corresponding gate line. The shift register includes an output module (12) for connecting a control signal output terminal (OUTPUT) of the shift register and a clock signal input terminal (CLKIN) under the control of the signal output from a driving module (11); a first pull-down module (13) for connecting the pull-up node (PU) and the second level signal input terminal (15) and connecting the control signal output terminal (OUTPUT) of the shift register and the second level signal input terminal (15) under the control of the signal output from a driving module (11); and a second pull-down module (14) for connecting the pull-up node (PU) and the second level signal input terminal (15) and connecting the control signal output terminal (OUTPUT) of the shift register and the second level signal input terminal (15) under the control of the signal output from a driving module (11).

20 Claims, 9 Drawing Sheets

SHIFT REGISTER, GATE DRIVING DEVICE AND LIQUID CRYSTAL DISPLAY DEVICE

CROSS REFERENCE TO RELATED APPLICATIONS

This application is based on International Application No. PCT/CN2013/077334 filed on Jun. 17, 2013, which claims priority to Chinese National Application No. 201310132519.0 filed on Apr. 16, 2013. The entire contents of each and every foregoing application are incorporated herein by reference.

TECHNICAL FIELD OF THE DISCLOSURE

The present disclosure relates to a field of liquid crystal display technology, and particularly to a shift register, a gate driving device and a liquid crystal display device.

BACKGROUND

A liquid crystal display panel comprises a two-dimensional liquid crystal pixel matrix, and driving devices for the liquid crystal display panel includes a gate driving device and a data driving device. The data driving device sequentially latches the display data as input and converts the same to analogy signals, and scans data lines of the liquid crystal display panel sequentially. The gate driving device includes a plurality of stages of shift registers, each stage of shift register transforms a clock signal as input into ON or OFF signal and outputs the same to a corresponding gate line via a control signal output terminal thereof.

In some special cases, there is a need for rotating a picture displayed on the liquid crystal display panel by 180°. So, the shift registers in the liquid crystal display panel should be able to achieve a bi-directional scanning, that is, the shift registers in the liquid crystal display panel should be bi-directional scanning shift registers.

A typical structure of an existing bi-directional scanning shift register is as shown in FIG. 1. During a non-operational time period of an Nth stage of shift register, that is, during a time period other than a time period in which a gate line corresponding to the Nth stage of shift register is activated and a time period in which a gate line corresponding to a stage of shift register previous to the Nth stage of shift register is activated, the ON signal VON is a high level signal and is input to a gate and a source (or a drain) of a transistor M6 so as ensure that a gate of a transistor M2 and a gate of a transistor M4 receive a high level signal, such that the transistor M2 and the transistor M4 are turned on. Since a source (or a drain) of the transistor M2 and a source (or a drain) of the transistor M4 are connected to the OFF signal VOFF which is a low level signal at this time, the transistor M2 can continuously discharge a node of the Nth stage of shift register which outputs a control signal GOUT(N), and the transistor M4 can continuously discharge a gate of a transistor M1, such that noise in the control signal GOUT(N) of the Nth stage of shift register can be removed, and drift in a threshold of the transistor M1 can be reduced. During a forward scanning, the stage of shift register previous to the Nth stage of shift register refers to an (N−1)th stage of shift register; during a reverse scanning, the stage of shift register previous to the Nth stage of shift register refers to an (N+1)th stage of shift register. In FIG. 1, the bi-directional scanning shift register further includes a clock signal CLK, a forward scan signal Vbuf, a control signal GOUT(N−1) of the (N−1)th stage of shift register, a reverse scan signal Vdis, a control signal GOUT(N+1) of the (N+1)th stage of shift register, a transistor M3, a transistor M5 and a transistor M7.

However, during time periods other than the time period in which the gate line corresponding to the Nth stage of shift register is activated and the time period in which the gate line corresponding to the stage of shift register previous to the Nth stage of shift register is activated, since the gate of the transistor M2, the gate of the transistor M4 and the gate of the transistor M6 in the Nth stage of shift register will be at a high level all the time, the transistor M2, the transistor M4 and the transistor M6 will be in a turn-on state all the time; though the noise produced by the coupling of the clock signal at the control signal output terminal of the shift register is removed, the threshold voltage of the transistors which are in the turn-on state all the time will drift, thus lifespan of the gate driving circuit is shortened.

To sum up, although the shift registers in the conventional gate driving device can remove the noise at the control signal output terminal of the shift register generated by coupling of the clock signal during the non-operational time period, that is, the noise on a gate line to which a shift register is connected can be removed during a time period in which the gate line is not activated, threshold voltages of some transistors in the shift register will drift as they are in the turn-on state all the time during the non-operational time period, and thus the lifespan of the gate driving device is shortened.

SUMMARY

Embodiments of the present disclosure provide a shift register, a gate driving device and a liquid crystal display device, which is capable of solving the problem that the lifespan of the gate driving device is shortened since some transistors in the existing shift register are in the turn-on state all the time during the non-operational time period.

Aiming at the above problem, in the embodiments of the present disclosure, there is provided a shift register including a driving module, an output module, a first pull-down module and a second pull-down module; wherein, the driving module is connected to the output module; the first pull-down module is connected to the driving module, the output module and a second level signal input terminal; the second pull-down module is connected to the driving module, the output module and the second level signal input terminal; wherein a connection point of the driving module, the output module, the first pull-down module and the second pull-down module is a pull-up node, a connection point of the first pull-down module and the driving module is a first pull-down node, a connection point of the first pull-down module and the output module is a control signal output terminal of the shift register; a connection point of the second pull-down module and the driving module is a second pull-down node, and a connection point of the second pull-down module and the output module is the control signal output terminal of the shift register; wherein the driving module is used for controlling the pull-up node to be at a first level and controlling the first pull-down node and the second pull-down node to be at a second level when a selection signal received is at the first level or changes from the first level to the second level, and is further used for controlling a signal at the first pull-down node to be same as a clock signal and controlling a signal at the second pull-down node to be same as a clock block signal when the pull-up node is at the second level; the output module is used for connecting the control signal output terminal of the shift register and a clock signal input terminal under the control of the signal at the pull-up node; the first pull-down module is used for connecting the pull-up node and the second level signal input terminal and for connecting the control signal output terminal of the shift register and the second level signal input terminal when the signal at the first pull-down node is at the first level; the second pull-down module is used for connecting the pull-up node and the second level signal input terminal and for connecting the control signal output terminal of the shift register and the second level signal input terminal when the signal at the second pull-down node is at the first level.

In the embodiments of the present disclosure, there is further provided a gate driving device including a plurality of stages of shift registers provided in the embodiments of the present disclosure; except a first stage of shift register and a last stage of shift register, each stage of shift register receives a control signal output from a stage of shift register previous thereto as a first selection signal and receives a control signal output from a stage of shift register next thereto as a second selection signal; the first stage of shift register receives a first initial trigger signal as a first selection signal and receives a control signal output from a second stage of shift register as a second selection signal; the last stage of shift register receives a second initial trigger signal as a second selection signal and receives a control signal output from a stage of shift register previous thereto as a first selection signal.

In the embodiments of the present disclosure, there is further provided a liquid crystal display device including the gate driving device provided in the embodiments of the present disclosure.

In the shift register, the gate driving device and the liquid crystal display device provided in the embodiments of the present disclosure, the output module in the shift register connects the control signal output terminal of the shift register and the clock signal input terminal under the control of the signal at the pull-up node, so as to drive the gate line corresponding to the shift register. During the non-operational time period of the shift register, that is, when the signal at the pull-up node is at the second level, the first pull-down node is at the first level and the second pull-down node is at the second level when the clock signal is at the first level and the clock block signal is at the second level; at this time, the first pull-down module connects the control signal output terminal of the shift register and the second level signal input terminal and connects the pull-up node and the second level signal input terminal; the first pull-down node is at the second level and the second pull-down node is at the first level when the clock signal is at the second level and the clock block signal is at the first level, at this time, the second pull-down module connects the control signal output terminal of the shift register and the second level signal input terminal and connects the pull-up node and the second level signal input terminal Therefore, during the non-operational time period of the shift register, the first pull-down module and the second pull-down module connect the pull-up node and the control signal output terminal of the shift register to the second level signal input terminal alternately, so that the noise at the control signal output terminal of the shift register generated by coupling of the clock signal during the non-operational time period of the shift register is removed, that is, the noise on the gate line connected to the shift register is removed during the time period in which the gate line is not activated, and so that the transistors in the first pull-down module and the second pull-down module are turned on alternately, thus avoiding the drifts of the threshold voltages of the transistors in the shift register caused by the long-term conduction of the transistors and prolonging the lifespan of the gate driving device including the shift register.

DETAILED DESCRIPTION

In a shift register, a gate driving device and a liquid crystal display device provided in the embodiments of the present disclosure, during a non-operational time period of the shift register, a first pull-down module and a second pull-down module connect a pull-up node and a control signal output terminal of the shift register to a second level signal input terminal alternately, so that noise at the control signal output terminal of the shift register generated by coupling of a clock signal during the non-operational time period of the shift register is removed, and lifespan of a gate driving device including the shift register is prolonged.

Below particular implementations of the shift register, the gate driving device and the liquid crystal display device provided in the embodiments of the present disclosure will be described with reference to accompanying drawings of the present disclosure.

Figure 1:
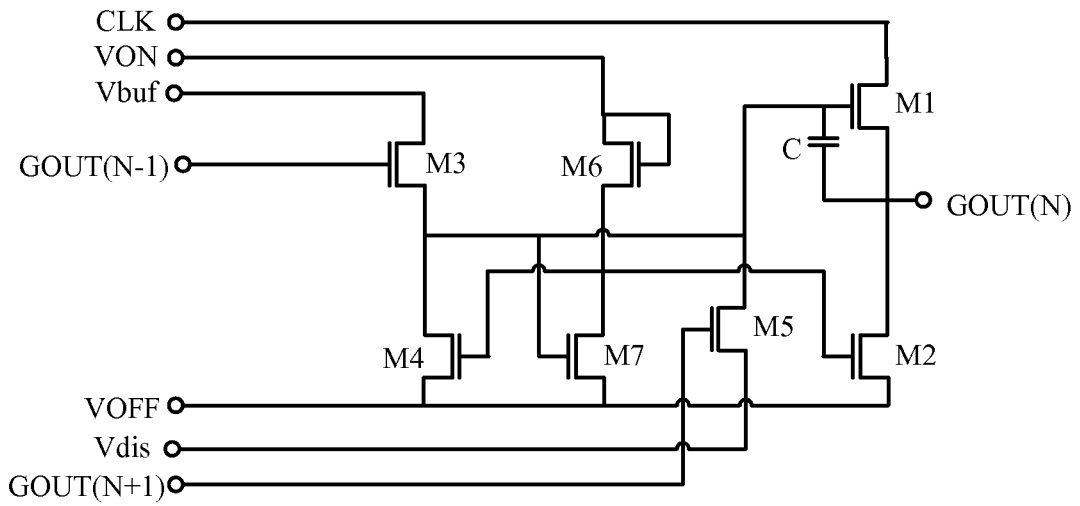
FIG. 1 is a schematic structure diagram of a bi-directional scanning shift register in the prior art.
Figure 2:
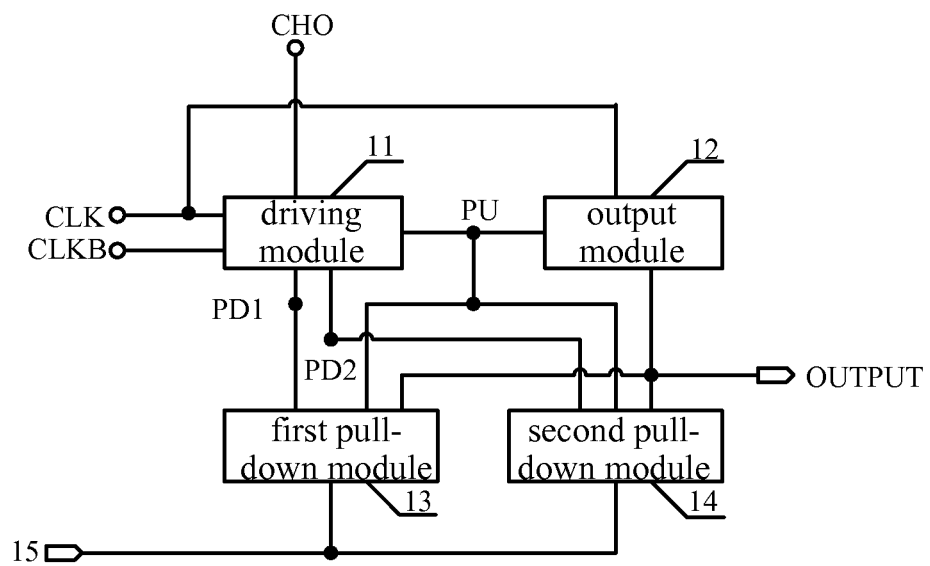
FIG. 2 is a first schematic structure diagram of a shift register provided in the embodiments of the present disclosure.

As shown in FIG. 2, the shift register provided in the embodiments of the present disclosure includes a driving module 11, an output module 12, a first pull-down module 13 and a second pull-down module 14; wherein, the driving module 11 is connected to the output module 12; the first pull-down module 13 is connected to the driving module 11, the output module 12 and a second level signal input terminal 15; the second pull-down module 14 is connected to the driving module 11, the output module 12 and the second level signal input terminal 15; wherein a connection point of the driving module 11, the output module 12, the first pull-down module 13 and the second pull-down module 14 is a pull-up node PU, a connection point of the first pull-down module 13 and the driving module 12 is a first pull-down node PD1, a connection point of the first pull-down module 13 and the output module 12 is a control signal output terminal OUTPUT of the shift register; a connection point of the second pull-down module 14 and the driving module 11 is a second pull-down node PD2, and a connection point of the second pull-down module 14 and the output module 12 is the control signal output terminal OUTPUT of the shift register.

The driving module 11 is used for controlling the pull-up node PU to be at a first level and controlling the first pull-down node PD1 and the second pull-down node PD2 to be at a second level when a selection signal CHO as received is at a first level and a clock signal CLK is at a second level; and the driving module 11 is further used for controlling the pull-up node PU to be at the first level and controlling the first pull-down node PD1 and the second pull-down node PD2 to be at the second level when the selection signal CHO received changes from the first level to the second level and the clock signal CLK is at the first level; and controlling a signal at the first pull-down node PD1 is the same as the clock signal CLK and controlling a signal at the second pull-down node PD2 is the same as the clock block signal CLKB when the pull-up node PU is at the second level. Since a clock block signal CLKB is at the second level when the clock signal CLK is at the first level, and the clock block signal CLKB is at the first level when the clock signal CLK is at the second level; in a case that the pull-up node PU is at the second level, the signal at the first pull-down node PD1 is at the first level and the signal at the second pull-down node PD2 is at the second level when the clock signal CLK is at the first level and the clock block signal CLKB is at the second level; in a case that the pull-up node PU is at the second level, the signal at the first pull-down node PD1 is at the second level and the signal at the second pull-down node PD2 is at the first level when the clock signal CLK is at the second level and the clock block signal CLKB is at the first level.

The output module 12 is used for connecting the control signal output terminal OUTPUT of the shift register and a clock signal input terminal CLKIN under the control of the signal at the pull-up node PU. That is, the control signal output terminal OUTPUT of the shift register and the clock signal input terminal CLKIN are connected when the signal at the pull-up node PU is at the first level; and the control signal output terminal OUTPUT of the shift register and the clock signal input terminal CLKIN are disconnected when the signal at the pull-up node PU is at the second level.

The first pull-down module 13 is used for connecting the pull-up node PU and the second level signal input terminal 15 and connecting the control signal output terminal OUTPUT of the shift register and the second level signal input terminal 15 when the signal at the first pull-down node PD1 is at the first level.

The second pull-down module 14 is used for connecting the pull-up node PU and the second level signal input terminal 15 and connecting the control signal output terminal OUTPUT of the shift register and the second level signal input terminal 15 when the signal at the second pull-down node PD2 is at the first level.

Figure 3:
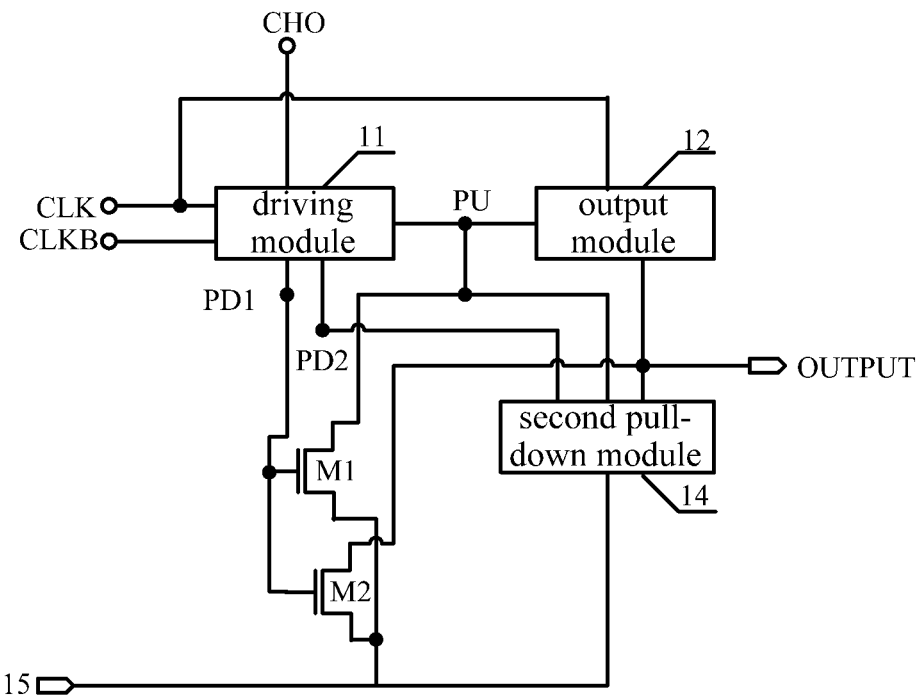
FIG. 3 is a second schematic structure diagram of a shift register provided in the embodiments of the present disclosure.

Furthermore, as shown in FIG. 3, the first pull-down module 13 includes a first transistor M1 and a second transistor M2; a gate of the first transistor M1 is connected to the first pull-down node PD1, a first electrode of the first transistor M1 is connected to the pull-up node PU, and a second electrode of the first transistor M1 is connected to the second level signal input terminal 15; a gate of the second transistor M2 is connected to the first pull-down node PD1, a first electrode of the second transistor M2 is connected to the control signal output terminal OUTPUT of the shift register, and a second electrode of the second transistor M2 is connected to the second level signal input terminal 15. The first transistor M1 is turned on when the signal at the first pull-down node PD1 is at the first level so as to connect the pull-up node PU and the second level signal input terminal 15, and is turned off when the signal at the first pull-down node PD1 is at the second level. The second transistor M2 is turned on when the signal at the first pull-down node PD1 is at the first level so as to connect the control signal output terminal OUTPUT of the shift register and the second level signal input terminal 15, and is turned off when the signal at the first pull-down node PD1 is at the second level.

Figure 4:
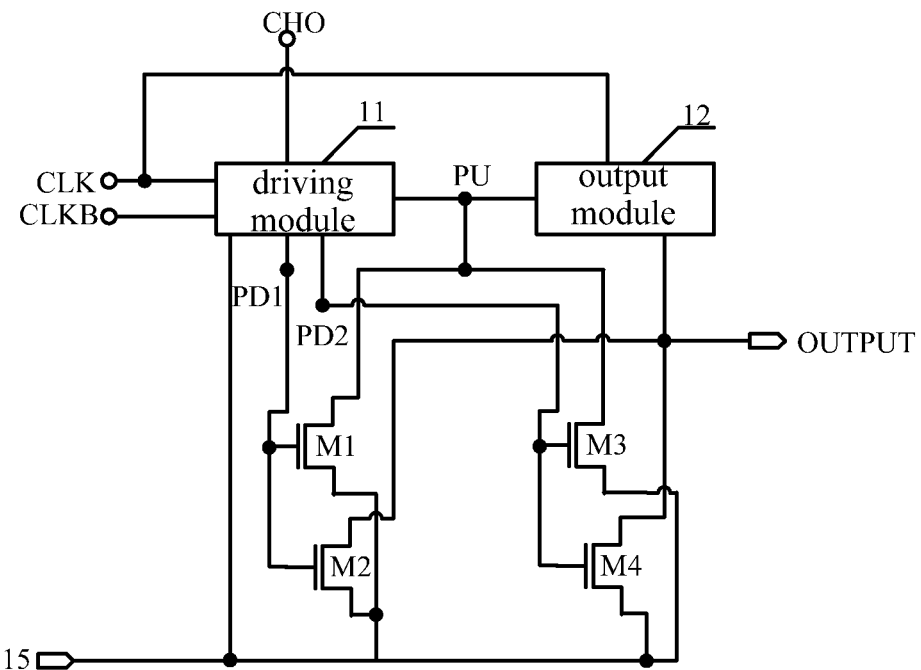
FIG. 4 is a third schematic structure diagram of a shift register provided in the embodiments of the present disclosure.

Furthermore, as shown in FIG. 4, the second pull-down module 14 includes a third transistor M3 and a fourth transistor M4; a gate of the third transistor M3 is connected to the second pull-down node PD2, a first electrode of the third transistor M3 is connected to the pull-up node PU, and a second electrode of the third transistor M3 is connected to the second level signal input terminal 15; a gate of the fourth transistor M4 is connected to the second pull-down node PD2, a first electrode of the fourth transistor M4 is connected to the control signal output terminal OUTPUT of the shift register, and a second electrode of the fourth transistor M4 is connected to the second level signal input terminal 15. The third transistor M3 is turned on when the signal at the second pull-down node PD2 is at the first level so as to connect the pull-up node and the second level signal input terminal 15, and is turned off when the signal at the second pull-down node PD2 is at the second level. The fourth transistor M4 is turned on when the signal at the second pull-down node PD2 is at the first level so as to connect the control signal output terminal of the shift register and the second level signal input terminal, and is turned off when the signal at the second pull-down node PD2 is at the second level.

Figure 5:
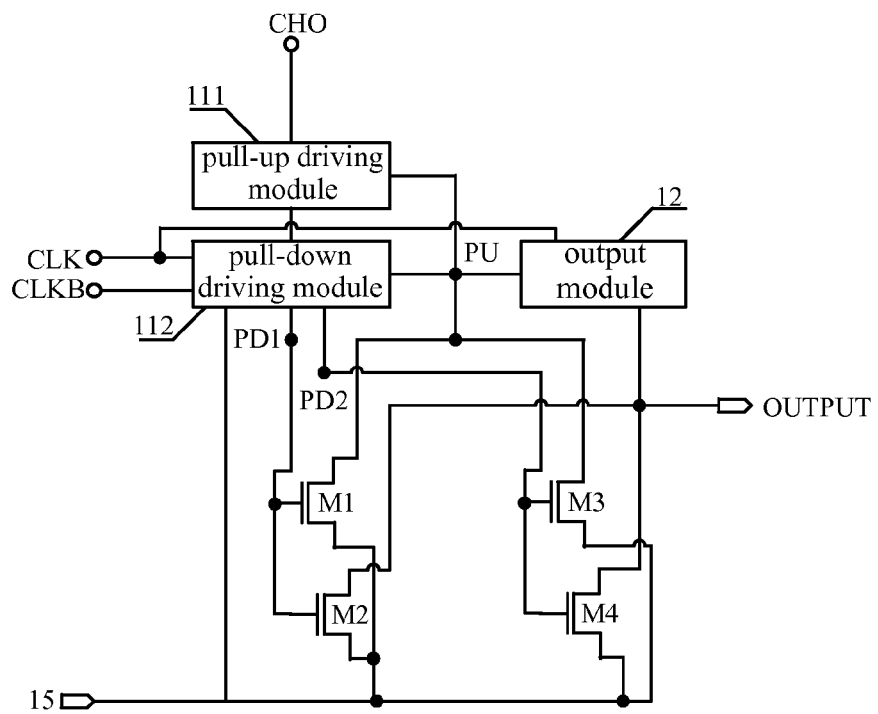
FIG. 5 is a fourth schematic structure diagram of a shift register provided in the embodiments of the present disclosure.

Furthermore, as shown in FIG. 5, the driving module 11 includes a pull-up driving module 111 and a pull-down driving module 112. The pull-up driving module 111 is used for controlling the pull-up node PU to be at the first level and for outputting a signal at the first level to the pull-down driving module 112 when the selection signal CHO received is at the first level; and is used for controlling the pull-up node PU to be at the first level and for outputting a signal at the second level to the pull-down driving module 112 when the selection signal CHO received changes from the first level to the second level. The pull-down driving module 112 is used for controlling the signal at the first pull-down node PD1 and the signal at the second pull-down node PD2 to be at the second level when the pull-up node PU is at the first level and the signal at the first level output from the pull-up driving module 111 is received, and for controlling the signal at the first pull-down node PD1 and the signal at the second pull-down node PD2 to be at the second level when the pull-up node PU is at the first level and the signal at the second level output from the pull-up driving module 111 is received; and is used for controlling the signal at the first pull-down node PD1 to be at the second level and the signal at the second pull-down node PD2 to be at the first level when the signal at the pull-up node PU is at the second level, the clock signal CLK received is at the second level and the clock block signal CLKB is at the first level, and is used for controlling the signal at the first pull-down node PD1 to be at the first level and the signal at the second pull-down node PD2 to be at the second level when the signal at the pull-up node PU is at the second level, the clock signal CLK received is at the first level and the clock block signal CLKB is at the second level.

Figure 6:
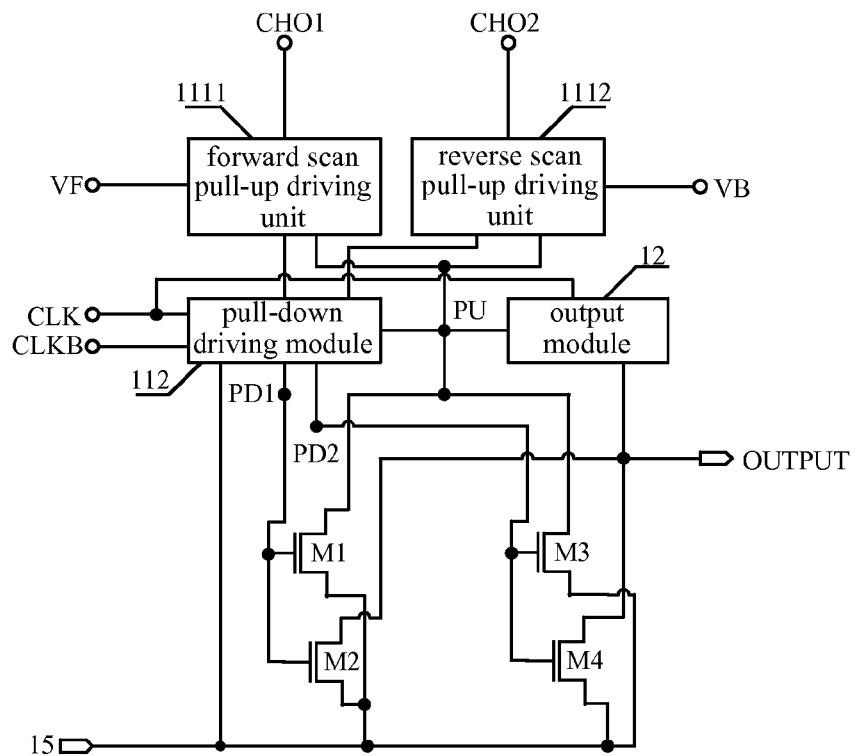
FIG. 6 is a fifth schematic structure diagram of a shift register provided in the embodiments of the present disclosure.

In a case in which the shift register provided in the embodiments of the present disclosure is a bi-directional scanning shift register, as shown in FIG. 6, the pull-up driving module 111 includes a forward scan pull-up driving unit 1111 and a reverse scan pull-up driving unit 1112. The forward scan pull-up driving unit 1111 is used for controlling the pull-up node PU to be at the first level and for outputting a signal at the first level to the pull-down driving module 112 when a forward scan signal VF received is at the first level and a first selection signal CHO1 received is at the first level; and is used for controlling the pull-up node PU to be at the first level and for outputting a signal at the second level to the pull-down driving module 112 when the forward scan signal VF received is at the first level and the first selection signal CHO1 received changes from the first level to the second level. The reverse scan pull-up driving unit 1112 is used for controlling the pull-up node PU to be at the first level and for outputting a signal at the first level to the pull-down driving module 112 when a reverse scan signal VB received is at the first level and a second selection signal CHO2 received is at the first level; and is used for controlling the pull-up node PU to be at the first level and for outputting a signal at the second level to the pull-down driving module 112 when the reverse scan signal VB received is at the first level and the second selection signal CHO2 received changes from the first level to the second level.

The first selection signal CHO1 received by the forward scan pull-up driving unit 1111 of the present stage of shift register is a signal output from the control signal output terminal OUTPUT of a previous stage of shift register, that is, if the present stage of shift register is an Nth stage of shift register, the first selection signal CHO1 received by the present stage of shift register is the signal output from the control signal output terminal OUTPUT of an (N−1)th stage of shift register. The second selection signal CHO2 received by the reverse scan pull-up driving unit 1112 of the present stage of shift register is a signal output from the control signal output terminal OUTPUT of a next stage of shift register, that is, if the present stage of shift register is an Nth stage of shift register, the second selection signal CHO2 received by the present stage shift register is the signal output from the control signal output terminal OUTPUT of an (N+1)th stage of shift register.

Figure 7:
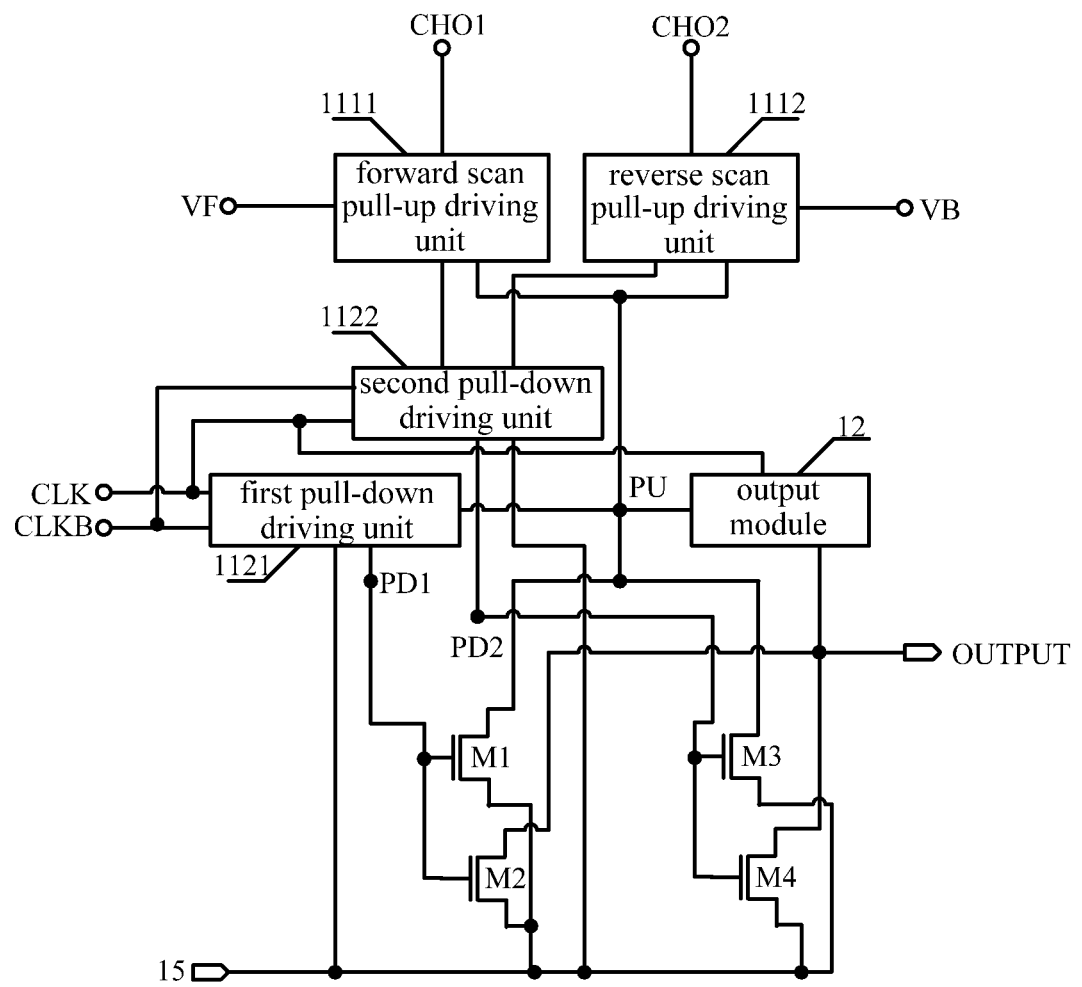
FIG. 7 is a sixth schematic structure diagram of a shift register provided in the embodiments of the present disclosure.

Furthermore, as shown in FIG. 7, the pull-down driving module 112 includes a first pull-down driving unit 1121 and a second pull-down driving unit 1122. The first pull-down driving unit 1121 is used for connecting the first pull-down node PD1 and the second level signal input terminal 15 when the signal at the pull-up node PU is at the first level; and is used for controlling the signal at the first pull-down node PD1 to be at the second level when the signal at the pull-up node PU is at the second level, the clock signal CLK received is at the second level and the clock block signal CLKB is at the first level, and is used for controlling the signal at the first pull-down node PD1 to be at the first level when the signal at the pull-up node PU is at the second level, the clock signal CLK received is at the first level and the clock block signal CLKB is at the second level. The second pull-down driving unit 1122 is used for connecting the second pull-down node PD2 and the second level signal input terminal 15 when the signal at the first level output from the pull-up driving module 111 is received; and is used for controlling the signal at the second pull-down node PD2 to be at the first level when the signal at the second level output from the pull-up driving module 111 is received, and when the clock signal CLK received is at the second level and the clock block signal CLKB is at the first level, and is used for controlling the signal at the second pull-down node PD2 to be at the second level when the signal at the second level output from the pull-up driving module 111 is received, and when the clock signal CLK received is at the first level and the clock block signal CLKB is at the second level.

Figure 8:
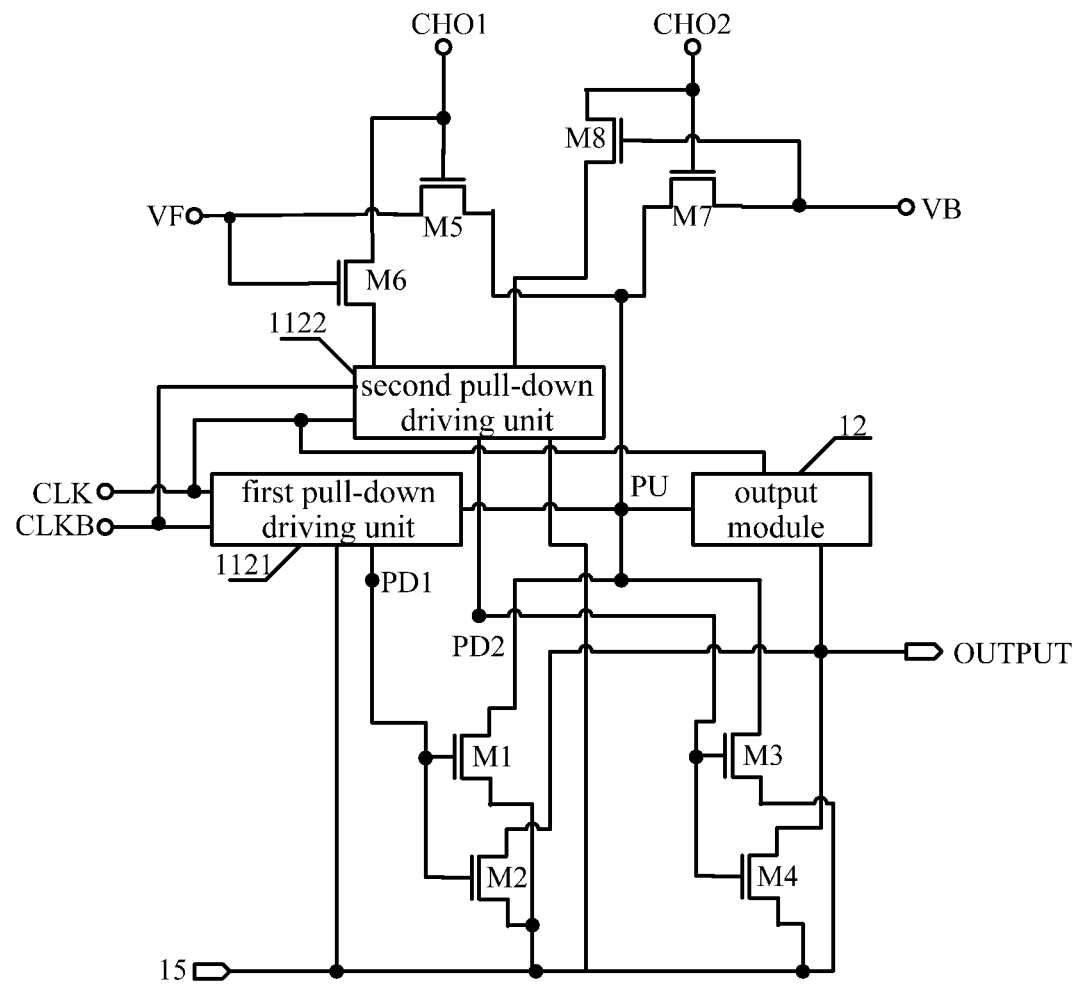
FIG. 8 is a seventh schematic structure diagram of a shift register provided in the embodiments of the present disclosure.

Furthermore, as shown in FIG. 8, the forward scan pull-up driving unit 1111 includes a fifth transistor M5 and a sixth transistor M6. A gate of the fifth transistor M5 receives the first selection signal CHO1, a first electrode of the fifth transistor M5 receives the forward scan signal VF, and a second electrode of the fifth transistor M5 is connected to the pull-up node PU; a first electrode of the sixth transistor M6 receives the first selection signal CHO1, a gate of the sixth transistor M6 receives the forward scan signal VF, and a second electrode of the sixth transistor M6 outputs a signal to the pull-down driving module 112.

The fifth transistor M5 is turned on when the first selection signal CHO1 received is at the first level so as to control the signal at the pull-up node PU to be same as the forward scan signal VF; and is turned off when the first selection signal CHO1 received is at the second level. The sixth transistor M6 is turned on when the forward scan signal VF received is at the first level so as to control the second electrode of the sixth transistor M6 to output a signal same as the first selection signal CHO1 to the pull-down driving module 112; and is turned off when the forward scan signal VF received is at the second level.

Furthermore, as shown in FIG. 8, the reverse scan pull-up driving unit 1112 includes a seventh transistor M7 and an eighth transistor M8. A gate of the seventh transistor M7 receives the second selection signal CHO2, a first electrode of the seventh transistor M7 receives the reverse scan signal VB, and a second electrode of the seventh transistor M7 is connected to the pull-up node PU; a first electrode of the eighth transistor M8 receives the second selection signal CHO2, a gate of the eighth transistor M8 receives the reverse scan signal VB, and a second electrode of the eighth transistor M8 outputs a signal to the pull-down driving module 112.

The seventh transistor M7 is turned on when the second selection signal CHO2 received is at the first level so as to control the signal at the pull-up node PU to be same as the reverse scan signal VB; and is turned off when the second selection signal CHO2 received is at the second level. The eighth transistor M8 is turned on when the reverse scan signal VB received is at the first level so as to control the second electrode of the eighth transistor M8 to output a signal same as the second selection signal CHO2 to the pull-down driving module 112; and is turned off when the reverse scan signal VB received is at the second level.

Figure 9:
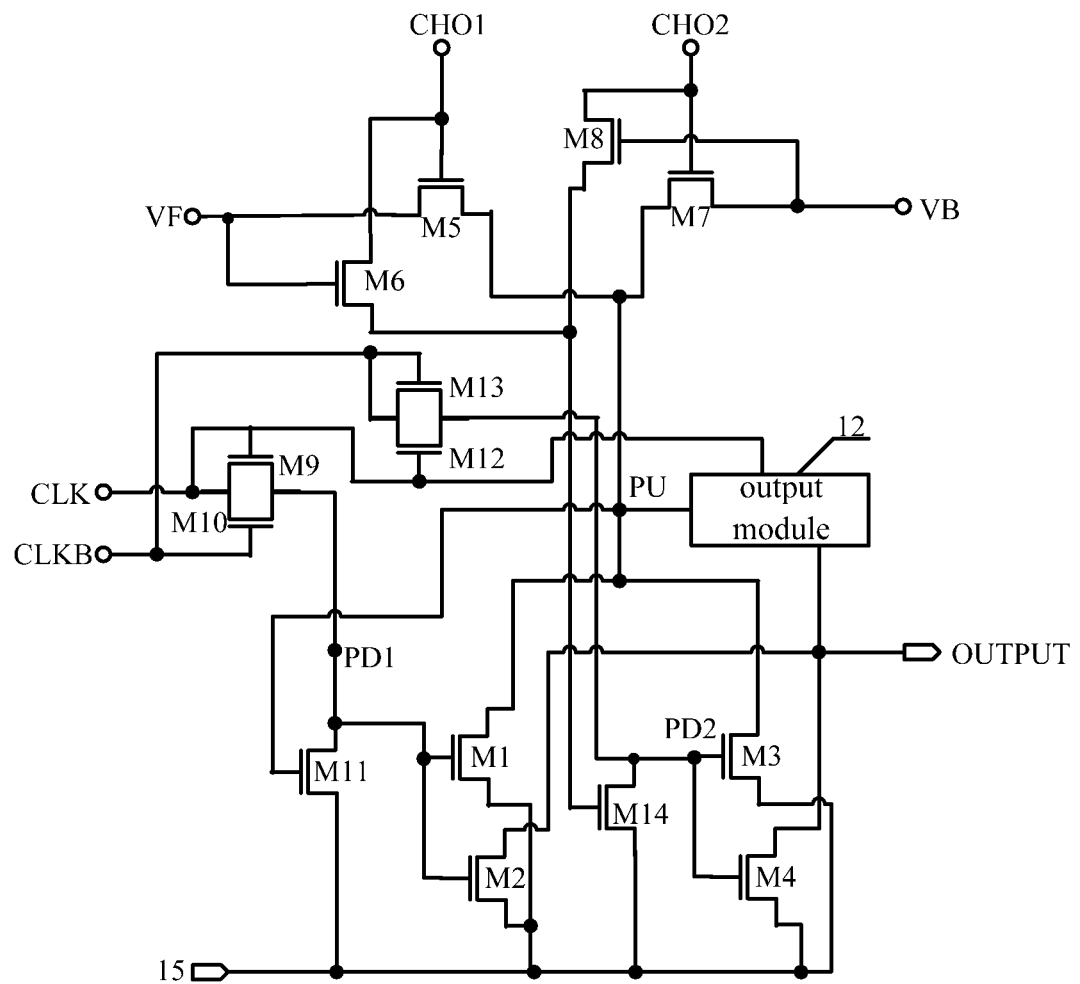
FIG. 9 is an eighth schematic structure diagram of a shift register provided in the embodiments of the present disclosure.

Furthermore, as shown in FIG. 9, the first pull-down driving unit 1121 includes a ninth transistor M9, a tenth transistor M10 and an eleventh transistor M11. A gate of the ninth transistor M9 receives the clock signal CLK, a first electrode of the ninth transistor M9 receives the clock signal CLK, a second electrode of the ninth transistor M9 is connected to the first pull-down node PD1; a gate of the tenth transistor M10 receives the clock block signal CLKB, a first electrode of the tenth transistor M10 receives the clock signal CLK, and a second electrode of the tenth transistor M10 is connected to the first pull-down node PD1; a gate of the eleventh transistor M11 is connected to the pull-up node PU, a first electrode of the eleventh transistor M11 is connected to the first pull-down node PD1, and a second electrode of the eleventh transistor M11 is connected to the second level signal input terminal 15. A ratio between the size of the ninth transistor M9 and the size of the eleventh transistor M11 is a first preset ratio so as to ensure the signal at the first pull-down node PD1 is at the second level during the time period in which the ninth transistor M9 and the eleventh transistor M11 are both turned on.

The ninth transistor M9 is turned on when the clock signal CLK received is at the first level, and is turned off when the clock signal CLK received is at the second level. The tenth transistor M10 is turned on when the clock block signal CLKB received is at the first level, and is turned off when the clock block signal CLKB received is at the second level. The eleventh transistor M11 is turned on when the signal at the pull-up node PU is at the first level so as to connect the first pull-down node PD1 and the second level signal input terminal 15; and is turned off when the signal at the pull-up node PU is at the second level so as to disconnect the first pull-down node PD1 from the second level signal input terminal 15.

Furthermore, as shown in FIG. 9, the second pull-down driving unit 1122 includes a twelfth transistor M12, a thirteenth transistor M13 and a fourteenth transistor M14. A gate of the twelfth transistor M12 receives the clock signal CLK, a first electrode of the twelfth transistor M12 receives the clock block signal CLKB, a second electrode of the twelfth transistor M12 is connected to the second pull-down node PD2; a gate of the thirteenth transistor M13 receives the clock block signal CLKB, a first electrode of the thirteenth transistor M13 receives the clock block signal CLKB, and a second electrode of the thirteenth transistor M13 is connected to the second pull-down node PD2; a gate of the fourteenth transistor M14 receives the signal output from the pull-up driving module 111, a first electrode of the fourteenth transistor M14 is connected to the second pull-down node PD2, and a second electrode of the fourteenth transistor M14 is connected to the second level signal input terminal 15. A ratio between the size of the thirteenth transistor M13 and the size of the fourteenth transistor M14 is a second preset ratio so as to ensure the signal at the second pull-down node PD2 is at the second level during the time period in which the thirteenth transistor M13 and the fourteenth transistor M14 are both turned on. The twelfth transistor M12 is turned on when the clock signal CLK received is at the first level, and is turned off when the clock signal CLK received is at the second level. The thirteenth transistor M13 is turned on when the clock block signal CLKB received is at the first level, and is turned off when the clock block signal CLKB received is at the second level. The fourteenth transistor M14 is turned on when the signal received which is output from the pull-up driving module 111 is at the first level so as to connect the second pull-down node PD2 and the second level signal input terminal 15; and is turned off when the signal received which is output from the pull-up driving module 111 is at the second level so as to disconnect the second pull-down node PD2 from the second level signal input terminal 15.

Figure 10:
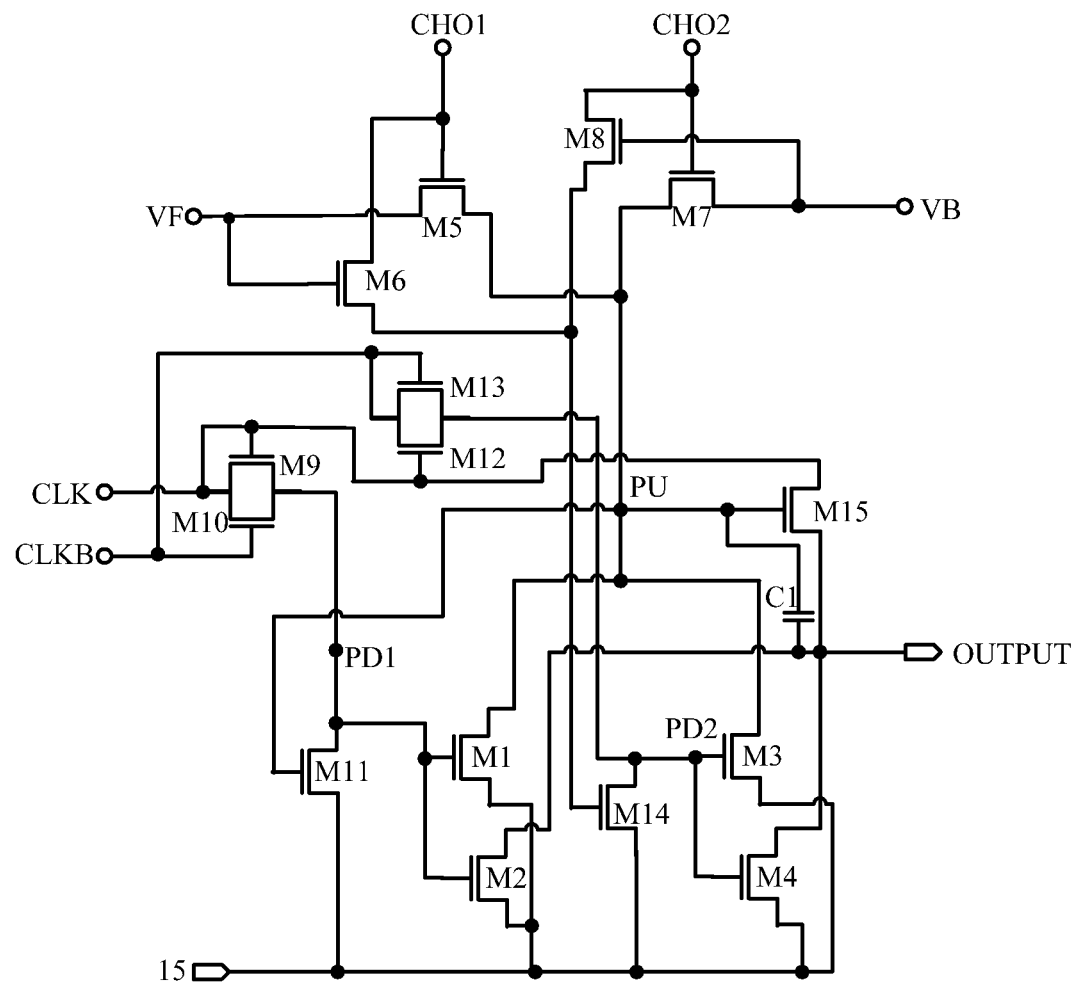
FIG. 10 is a ninth schematic structure diagram of a shift register provided in the embodiments of the present disclosure.

Furthermore, as shown in FIG. 10, the output module 12 includes a fifteenth transistor M15 and a capacitor C1. A gate of the fifteenth transistor M15 is connected to the pull-up node PU, a first electrode of the fifteenth transistor M15 receives the clock signal CLK, a second electrode of the fifteenth transistor M15 serves as the control signal output terminal OUTPUT of the shift register; one terminal of the capacitor C1 is connected to the pull-up node PU, and the other terminal of the capacitor C1 is connected to the second electrode of the fifteenth transistor M15. The fifteenth transistor M15 is turned on when the signal at the pull-up node PU is at the first level so as to output the received clock signal CLK through the control signal output terminal OUTPUT of the shift register; and is turned off when the signal at the pull-up node PU is at the second level. The capacitor C1 is used to store the signal at the pull-up node PU.

For a transistor in the field of liquid crystal display, there is no distinct difference between a drain and a source, therefore a first electrode of the transistor as mentioned in the embodiments of the present disclosure may be the source (or the drain) of the transistor, and a second electrode of the transistor may be the drain (or the source) of the transistor. The drain of the transistor may be the second electrode if the source of the transistor serves as the first electrode, or the source of the transistor may be the second electrode if the drain of the transistor serves as the first electrode.

In a case that the transistors as mentioned in the embodiments of the present disclosure are N type transistors, the first level is a high level, the second level is a low level, and the second level signal input terminal is a low level signal input terminal; in a case that the transistors as mentioned in the embodiments of the present disclosure are P type transistors, the first level is a low level, the second level is a high level, and the second level signal input terminal is a high level signal input terminal.

Figure 11:
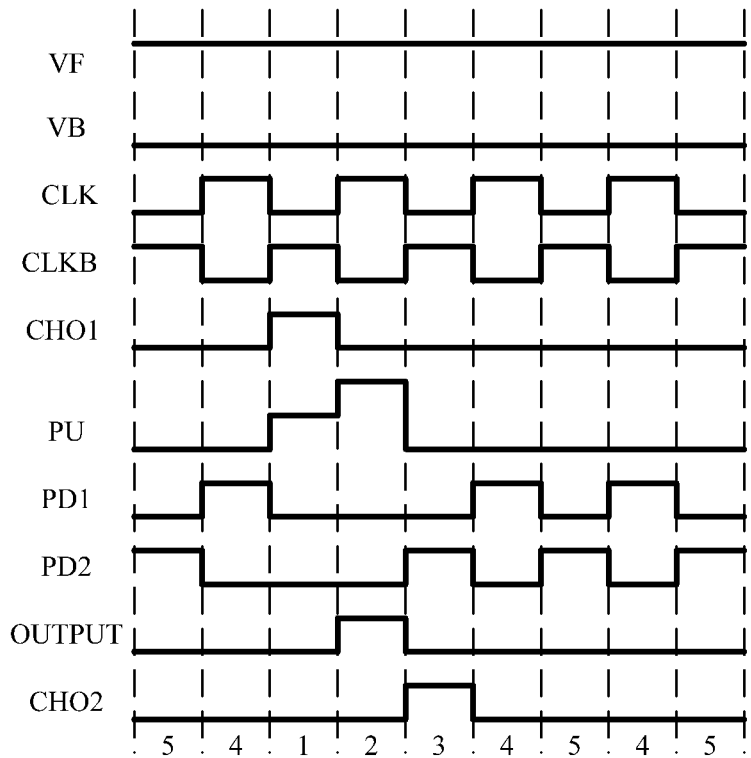
FIG. 11 is a timing diagram for operations when the shift register provided in the present disclosure performs a forward scanning.
Figure 12:
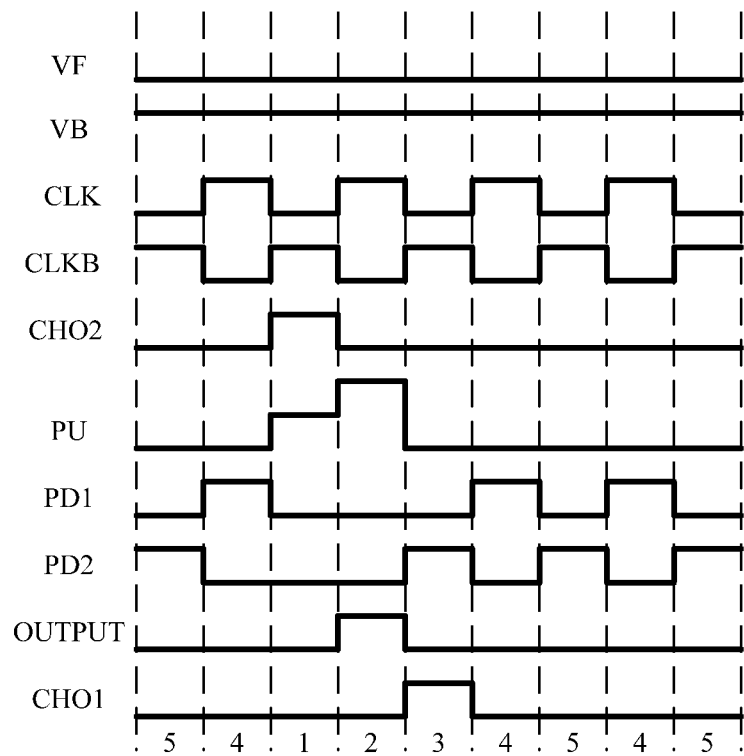
FIG. 12 is a timing diagram for operations when the shift register provided in the present disclosure performs a reverse scanning.

In order to further describe the shift register provided in the embodiments of the present disclosure, the operational principle of the shift register provided in the embodiments of the present disclosure will be described below with reference to the timing diagrams as shown in FIG. 11 and FIG. 12, by taking the transistors as mentioned in the embodiments of the present disclosure being N-type transistors as an example. FIG. 11 is a timing diagram for operations when the shift register performs a forward scanning, and FIG. 12 is a timing diagram for operations when the shift register performs a reverse scanning.

As shown in FIG. 11, during a forward scanning, the forward scan signal VF is a high level signal, and the reverse scan signal VB is a low level signal, wherein the operational timing of the shift register provided in the embodiments of the present disclosure may be divided into five phases.

During a first phase, the clock signal CLK is at a low level, the clock block signal CLKB is at a high level, the first selection signal CHO1 is at a high level, and the second selection signal CHO2 is at a low level. At this time, the fifth transistor M5 is turned on since the first selection signal CHO1 received at the gate of the fifth transistor M5 is at a high level, and the fifteenth transistor M15 is turned on since the signal at the pull-up node PU is at a high level and the capacitor C1 stores such a high level signal. The ninth transistor M9 is turned off and the tenth transistor M10 is turned on since the clock signal CLK is at a low level and the clock block signal CLKB is at a high level, so that the signal at the first pull-down node PD1 is same as the clock signal CLK, that is, the signal at the first pull-down node PD1 is at a low level, and the twelfth transistor M12 is turned off and the thirteenth transistor M13 is turned on. At this time, the eleventh transistor M11 is turned on since the signal at the pull-up node PU is at a high level, meanwhile the first pull-down node PD1 is connected to the second level signal input terminal 15, that is, the first pull-down node PD1 is connected to a low level signal input terminal, and thus the first transistor M1 is turned off and the second transistor M2 is turned off. The sixth transistor M6 is turned on since the forward scan signal VF is at a high level, so that the gate of the fourteenth transistor M14 receives the first selection signal CHO1 which is at a high level at this time, that is, the gate of the fourteenth transistor M14 receives a high level signal, and thus the fourteenth transistor M14 is turned on. Since the ratio between the size of the thirteenth transistor M13 and the size of the fourteenth transistor M14 is the second preset ratio, which may ensure that the signal at the second pull-down node PD2 is at a low level when the thirteenth transistor M13 and the fourteenth transistor M14 are turned on at the same time, the third transistor M3 is turned off and the fourth transistor M4 is turned off. The clock signal CLK is output from the control signal output terminal OUTPUT of the shift register through the fifteenth transistor M15 which is turned on, that is, the control signal output terminal OUTPUT of the shift register outputs a low level signal at this time.

During a second phase, the clock signal CLK is at a high level, the clock block signal CLKB is at a low level, the first selection signal CHO1 is at a low level, and the second selection signal CHO2 is at a low level. At this time, the fifth transistor M5 is turned off since the first selection signal CHO1 received at the gate of the fifth transistor M5 is at a low level; the seventh transistor M7 is turned off since the second selection signal CHO2 received at the gate of the seventh transistor M7 is at a low level; the ninth transistor M9 is turned on, the tenth transistor M10 is turned off, the twelfth transistor M12 is turned on and the thirteenth transistor M13 is turned off, since the clock signal CLK is at a high level and the clock block signal CLKB is at a low level; and the eleventh transistor M11 is turned on since the signal at the pull-up node PU is at a high level. The ratio between the size of the ninth transistor M9 and the size of the eleventh transistor M11 is the first preset ratio, which may ensure that the signal at the first pull-down node PD1 is at a low level when the ninth transistor M9 and the eleventh transistor M11 are turned on at the same time; the first transistor M1 is turned off when receiving the low level signal from the first pull-down node PD1, and the second transistor M2 is turned off when receiving the low level signal from the first pull-down node PD1. The sixth transistor M6 is turned on since the forward scan signal VF is at a high level, so that the gate of the fourteenth transistor M14 receives the first selection signal CHO1 which is at a low level at this time, and thus the gate of the fourteenth transistor M14 receives a low level signal, thus the fourteenth transistor M14 is turned off. The second pull-down node PD2 may receive the clock block signal CLKB since the twelfth transistor M12 is turned on, that is, the signal at the second pull-down node PD2 is at a low level; the third transistor M3 is turned off when receiving the low level signal from the second pull-down node PD2 and the fourth transistor M4 is turned off when receiving the low level signal from the second pull-down node PD2. The pull-up node PU is kept to be at a high level due to existence of the capacitor C1, the fifteenth transistor M15 is maintained to be turned on, and thus the clock signal CLK is output from the control signal output terminal OUTPUT of the shift register through the fifteenth transistor M15 which is turned on, that is, the control signal output terminal OUTPUT of the shift register outputs a high level signal at this time.

During a third phase, the clock signal CLK is at a low level, the clock block signal CLKB is at a high level, the first selection signal CHO1 is at a low level, and the second selection signal CHO2 is at a high level. At this time, the fifth transistor M5 is turned off since the first selection signal CHO1 received at the gate of the fifth transistor M5 is at a low level; the seventh transistor M7 is turned on since the second selection signal CHO2 received at the gate of the seventh transistor M7 is at a high level; the ninth transistor M9 is turned off, the tenth transistor M10 is turned on, the twelfth transistor M12 is turned off and the thirteenth transistor M13 is turned on, since the clock signal CLK is at a low level and the clock block signal CLKB is at a high level. The first pull-down node PD1 can receive the clock signal CLK since the tenth transistor M10 is turned on, that is, the signal at the first pull-down node PD1 is at a low level at this time. The eighth transistor M8 is turned off since the reverse scan signal VB is at a low level, and the sixth transistor M6 is turned on since the forward scan signal VF is at a high level, so that the gate of the fourteenth transistor M14 receives the first selection signal CHO1, that is, the gate of the fourteenth transistor M14 receives a low level signal, and thus the fourteenth transistor M14 is turned off. In addition, the second pull-down node PD2 can receive the clock block signal CLKB since the thirteenth transistor M13 is turned on, that is, the signal at the second pull-down node PD2 is a high level signal. At this time, the third transistor M3 and the fourth transistor M4 are both turned on since the gates of the third transistor M3 and the fourth transistor M4 are at a high level, so that the pull-up node PU is connected to the second level signal input terminal, that is, the signal at the pull-up node PU is at a low level, and thus the fifteenth transistor M15 is turned off the control signal output terminal OUTPUT of the shift register is connected to the second level signal input terminal, that is, the control signal output terminal OUTPUT of the shift register outputs a low level signal.

During a fourth phase, the clock signal CLK is at a high level, the clock block signal CLKB is at a low level, the first selection signal CHO1 is at a low level, and the second selection signal CHO2 is at a low level. At this time, the fifth transistor M5 is turned off since the first selection signal CHO1 received at the gate of the fifth transistor M5 is at a low level; the seventh transistor M7 is turned off since the second selection signal CHO2 received at the gate of the seventh transistor M7 is at a low level; the ninth transistor M9 is turned on, the tenth transistor M10 is turned off, the twelfth transistor M12 is turned on and the thirteenth transistor M13 is turned off, since the clock signal CLK is at a high level and the clock block signal CLKB is at a low level; the eleventh transistor M11 is turned off since the signal at the pull-up node PU is at a low level; and thus the first transistor M1 and the second transistor M2 are both turned on since the signal at the first pull-down node PD1 is at a high level when the ninth transistor M9 is turned on. Therefore, the control signal output terminal OUTPUT of the shift register is connected to the second level signal input terminal, that is, the control signal output terminal OUTPUT of the shift register outputs a low level signal at this time. The eighth transistor M8 is turned off since the reverse scan signal VB is at a low level, and the sixth transistor M6 is turned on since the forward scan signal VF is at a high level, so that the gate of the fourteenth transistor M14 can receive the first selection signal CHO1, that is, the gate of the fourteenth transistor M14 is at a low level at this time, and thus the fourteenth transistor M14 is turned off, therefore the second pull-down node PD2 can receive the clock block signal CLKB, that is, the signal at the second pull-down node PD2 is at a low level.

During a fifth period, the clock signal CLK is at a low level, the clock block signal CLKB is at a high level, the first selection signal CHO1 is at a low level, and the second selection signal CHO2 is at a low level. At this time, the fifth transistor M5 is turned off since the first selection signal CHO1 received at the gate of the fifth transistor M5 is at a low level; the seventh transistor M7 is turned off since the second selection signal CHO2 received at the gate of the seventh transistor M7 is at a low level; the ninth transistor M9 is turned off, the tenth transistor M10 is turned on, the twelfth transistor M12 is turned off and the thirteenth transistor M13 is turned on, since the clock signal CLK is at a low level and the clock block signal CLKB is at a high level. The eleventh transistor M11 is turned off since the signal at the pull-up node PU is at a low level, and thus the first pull-down node PD1 can receive the clock signal CLK when the tenth transistor M10 is turned on, that is, the signal at the first pull-down node PD1 is a low level signal at this time, so the first transistor M1 and the second transistor M2 are both turned off. The eighth transistor M8 is turned off since the reverse scan signal VB is at a low level, and the sixth transistor M6 is turned on since the forward scan signal VF is a high level signal, so that the gate of the fourteenth transistor M14 can receive the first selection signal CHO1, that is, the gate of the fourteenth transistor M14 receives a low level signal, and thus the fourteenth transistor M14 is turned off. Therefore, the second pull-down node PD2 can receive the clock block signal CLKB, that is, the signal at the second pull-down node PD2 is at a high level, and thus the third transistor M3 and the fourth transistor M4 are both turned on, so that the pull-up node PU is connected to the second level signal input terminal, that is, the signal at the pull-up node PU is at a low level; the control signal output terminal OUTPUT of the shift register is connected to the second level signal input terminal, that is, the control signal output terminal OUTPUT of the shift register outputs a low level signal at this time.

After that, the fourth phase and the fifth phase are repeated alternately until the first selection signal CHO1 received by the shift register provided in the embodiments of the present disclosure is at a high level, and the first phase will be performed again. In this manner, during the fourth phase and the fifth phase, the signal at the first pull-down node PD1 is same as the clock signal CLK, and the signal at the second pull-down node PD2 is same as the clock block signal CLKB; the third transistor M3 and the fourth transistor M4 are both turned off under the control of the signal at the second pull-down node PD2, when the first transistor M1 and the second transistor M2 are both turned on under the control of the signal at the first pull-down node PD1; the third transistor M3 and the fourth transistor M4 are both turned on under the control of the signal at the second pull-down node PD2, when the first transistor M1 and the second transistor M2 are both turned off under the control of the signal at the first pull-down node PD1. Thus, it can be avoided that some transistors in the shift register are turned on for a long time during the time period in which the gate line corresponding to shift register is not activated and that the threshold voltages of these transistors drift in turn, and thus the lifespan of the gate driving device including the shift register may be prolonged.

As shown in FIG. 12, during a reverse scanning, the forward scan signal VF is a low level signal, and the reverse scan signal VB is a high level signal, wherein the operational timing of the shift register provided in the embodiments of the present disclosure may be divided into five phases.

During a first phase, the clock signal CLK is at a low level, the clock block signal CLKB is at a high level, the first selection signal CHO1 is at a low level, and the second selection signal CHO2 is at a high level. At this time, the fifth transistor M5 is turned off since the first selection signal CHO1 received at the gate of the fifth transistor M5 is at a low level, the seventh transistor M7 is turned on since the second selection signal CHO2 received at the gate of the seventh transistor M7 is at a high level, and the fifteenth transistor M15 is turned on since the signal at the pull-up node PU is at a high level and the capacitor C1 stores such a high level signal. Since the clock signal CLK is at a low level and the clock block signal CLKB is at a high level, the ninth transistor M9 is turned off and the tenth transistor M10 is turned on, so that the signal at the first pull-down node PD1 is same as the clock signal CLK, that is, the signal at the first pull-down node PD1 is at a low level, and the twelfth transistor M12 is turned off and the thirteenth transistor M13 is turned on. At this time, the eleventh transistor M11 is turned on since the signal at the pull-up node PU is at a high level, meanwhile the first pull-down node PD1 is connected to the second level signal input terminal 15, that is, the first pull-down node PD1 is connected to a low level signal input terminal, and thus the first transistor M1 is turned off and the second transistor M2 is turned off. The eighth transistor M8 is turned on since the reverse scan signal VB is at a high level, so that the gate of the fourteenth transistor M14 receives the second selection signal CHO2 which is at a high level at this time, that is, the gate of the fourteenth transistor M14 receives a high level signal, and thus the fourteenth transistor M14 is turned on. Since the ratio between the size of the thirteenth transistor M13 and the size of the fourteenth transistor M14 is the second preset ratio, which may ensure that the signal at the second pull-down node PD2 is at a low level when the thirteenth transistor M13 and the fourteenth transistor M14 are turned on at the same time, the third transistor M3 is turned off and the fourth transistor M4 is turned off. The clock signal CLK is output from the control signal output terminal OUTPUT of the shift register through the fifteenth transistor M15 which is turned on, that is, the control signal output terminal OUTPUT of the shift register outputs a low level signal at this time.

During a second phase, the clock signal CLK is at a high level, the clock block signal CLKB is at a low level, the first selection signal CHO1 is at a low level, and the second selection signal CHO2 is at a low level. At this time, the fifth transistor M5 is turned off since the first selection signal CHO1 received at the gate of the fifth transistor M5 is at a low level; the seventh transistor M7 is turned off since the second selection signal CHO2 received at the gate of the seventh transistor M7 is at a low level; the ninth transistor M9 is turned on, the tenth transistor M10 is turned off, the twelfth transistor M12 is turned on and the thirteenth transistor M13 is turned off, since the clock signal CLK is at a high level and the clock block signal CLKB is at a low level; and the eleventh transistor M11 is turned on since the signal at the pull-up node PU is at a high level. The ratio between the size of the ninth transistor M9 and the size of the eleventh transistor M11 is the first preset ratio, which may ensure that the signal at the first pull-down node PD1 is at a low level when the ninth transistor M9 and the eleventh transistor M11 are turned on at the same time; the first transistor M1 is turned off when receiving the low level signal from the first pull-down node PD1, and the second transistor M2 is turned off when receiving the low level signal from the first pull-down node PD1. The eighth transistor M8 is turned on since the reverse scan signal VB is a high level signal, so that the gate of the fourteenth transistor M14 receives the second selection signal CHO2 which is at a low level at this time, and thus the gate of the fourteenth transistor M14 receives a low level signal, the fourteenth transistor M14 is turned off. The second pull-down node PD2 may receive the clock block signal CLKB since the twelfth transistor M12 is turned on, that is, the signal at the second pull-down node PD2 is at a low level; the third transistor M3 is turned off when receiving the low level signal from the second pull-down node PD2, and the fourth transistor M4 is turned off when receiving the low level signal from the second pull-down node PD2. The pull-up node PU is kept at a high level due to existence of the capacitor C1, the fifteenth transistor M15 is maintained to be turned on, and thus the clock signal CLK is output from the control signal output terminal OUTPUT of the shift register through the fifteenth transistor M15 which is turned on, that is, the control signal output terminal OUTPUT of the shift register outputs a high level signal at this time.

During a third phase, the clock signal CLK is at a low level, the clock block signal CLKB is at a high level, the first selection signal CHO1 is at a high level, and the second selection signal CHO2 is at a low level. At this time, the fifth transistor M5 is turned on since the first selection signal CHO1 received at the gate of the fifth transistor M5 is at a high level; the seventh transistor M7 is turned off since the second selection signal CHO2 received at the gate of the seventh transistor M7 is at a low level; the ninth transistor M9 is turned off, the tenth transistor M10 is turned on, the twelfth transistor M12 is turned off and the thirteenth transistor M13 is turned on, since the clock signal CLK is at a low level and the clock block signal CLKB is at a high level. The first pull-down node PD1 can receive the clock signal CLK since the tenth transistor M10 is turned on, that is, the signal at the first pull-down node PD1 is at a low level at this time. The sixth transistor M6 is turned off since the forward scan signal VF is a low level signal, and the eighth transistor M8 is turned on since the reverse scan signal VB is a high level signal, so that the gate of the fourteenth transistor M14 receives the second selection signal CHO2, that is, the gate of the fourteenth transistor M14 receives a low level signal, and thus the fourteenth transistor M14 is turned off. In addition, the second pull-down node PD2 can receive the clock block signal CLKB since the thirteenth transistor M13 is turned on, that is, the signal at the second pull-down node PD2 is at a high level. At this time, the third transistor M3 and the fourth transistor M4 are both turned on since the gates of the third transistor M3 and the fourth transistor M4 are at a high level, so that the pull-up node PU is connected to the second level signal input terminal, that is, the signal at the pull-up node PU is at a low level, and thus the fifteenth transistor M15 is turned off. The control signal output terminal OUTPUT of the shift register is connected to the second level signal input terminal, that is, the control signal output terminal OUTPUT of the shift register outputs a low level signal at this time.

During a fourth phase, the clock signal CLK is at a high level, the clock block signal CLKB is at a low level, the first selection signal CHO1 is at a low level, and the second selection signal CHO2 is at a low level. At this time, the fifth transistor M5 is turned off since the first selection signal CHO1 received at the gate of the fifth transistor M5 is at a low level; the seventh transistor M7 is turned off since the second selection signal CHO2 received at the gate of the seventh transistor M7 is at a low level; the ninth transistor M9 is turned on, the tenth transistor M10 is turned off, the twelfth transistor M12 is turned on and the thirteenth transistor M13 is turned off, since the clock signal CLK is at a high level and the clock block signal CLKB is at a low level; the eleventh transistor M11 is turned off since the signal at the pull-up node PU is at a low level; and thus the first transistor M1 and the second transistor M2 are both turned on since the signal at the first pull-down node PD1 is at a high level when the ninth transistor M9 is turned on. Therefore, The control signal output terminal OUTPUT of the shift register is connected to the second level signal input terminal, that is, the control signal output terminal OUTPUT of the shift register outputs a low level signal at this time. The eighth transistor M8 is turned on since the reverse scan signal VB is a high level signal, and the sixth transistor M6 is turned off since the forward scan signal VF is a low level signal, so that the gate of the fourteenth transistor M14 receives the second selection signal CHO2, that is, the gate of the fourteenth transistor M14 is at a low level at this time, and thus the fourteenth transistor M14 is turned off, therefore the second pull-down node PD2 can receive the clock block signal CLKB, that is, the signal at the second pull-down node PD2 is at a low level.

During a fifth period, the clock signal CLK is at a low level, the clock block signal CLKB is at a high level, the first selection signal CHO1 is at a low level, and the second selection signal CHO2 is at a low level. At this time, the fifth transistor M5 is turned off since the first selection signal CHO1 received at the gate of the fifth transistor M5 is at a low level; the seventh transistor M7 is turned off since the second selection signal CHO2 received at the gate of the seventh transistor M7 is at a low level; the ninth transistor M9 is turned off, the tenth transistor M10 is turned on, the twelfth transistor M12 is turned off and the thirteenth transistor M13 is turned on, since the clock signal CLK is at a low level and the clock block signal CLKB is at a high level. The eleventh transistor M11 is turned off since the signal at the pull-up node PU is at a low level, and thus the first pull-down node PD1 can receive the clock signal CLK when the tenth transistor M10 is turned on, that is, the signal at the first pull-down node PD1 is at a low level at this time, so the first transistor M1 and the second transistor M2 are both turned off. The eighth transistor M8 is turned on since the reverse scan signal VB is a high level signal, and the sixth transistor M6 is turned off since the forward scan signal VF is a low level signal, so that the gate of the fourteenth transistor M14 can receive the second selection signal CHO2, that is, the gate of the fourteenth transistor M14 receives a low level signal, and thus the fourteenth transistor M14 is turned off. Therefore, the second pull-down node PD2 can receive the clock block signal CLKB, that is, the signal at the second pull-down node PD2 is at a high level, and thus the third transistor M3 and the fourth transistor M4 are both turned on, so that the pull-up node PU is connected to the second level signal input terminal, that is, the signal at the pull-up node PU is at a low level; the control signal output terminal OUTPUT of the shift register is connected to the second level signal input terminal, that is, the control signal output terminal OUTPUT of the shift register outputs a low level signal at this time.

After that, the fourth phase and the fifth phase are repeated alternately until the second selection signal CHO2 received by the shift register provided in the embodiments of the present disclosure is at a high level, and the first phase will be performed again. In this manner, during the fourth phase and the fifth phase, the signal at the first pull-down node PD1 is same as the clock signal CLK, and the signal at the second pull-down node PD2 is same as the clock block signal CLKB; the third transistor M3 and the fourth transistor M4 are both turned off under the control of the signal at the second pull-down node PD2, when the first transistor M1 and the second transistor M2 are both turned on under the control of the signal at the first pull-down node PD1; the third transistor M3 and the fourth transistor M4 are both turned on under the control of the signal at the second pull-down node PD2, when the first transistor M1 and the second transistor M2 are both turned off under the control of the signal at the first pull-down node PD1. Thus, it can be avoided that some transistors in the shift register are turned on for a long time during the time period in which the gate line corresponding to shift register is not activated and that the threshold voltages of these transistors drift in turn, and thus the lifespan of the gate driving device including the shift register may be prolonged.

Difference between a P type transistor and an N type transistor merely lies in that: the P type transistor is turned on when signal received at a gate thereof is a low level signal and is turned off when the signal received at the gate thereof is a high level signal; whereas the N type transistor is turned on when signal received at a gate thereof is a high level signal and is turned off when the signal received at the gate thereof is a low level signal. Therefore, the operational principle of the shift register in which the transistors included therein are all P type transistors is similar to the operational principle of the shift register in which the transistors included therein are all N type transistors, details omitted.

In the embodiments of the present disclosure, there is provided a gate driving device including a plurality of shift registers provided in the embodiments of the present disclosure, except a first stage of shift register and a last stage of shift register, each stage of shift register receives a control signal output from a stage of shift register previous thereto as a first selection signal and receives a control signal output from a stage of shift register next thereto as a second selection signal; the first stage of shift register receives a first initial trigger signal as a first selection signal and receives a control signal output from a second stage of shift register as a second selection signal; the last stage of shift register receives a second initial trigger signal as a second selection signal and receives a control signal output from a stage of shift register previous thereto as a first selection signal.

Figure 13:
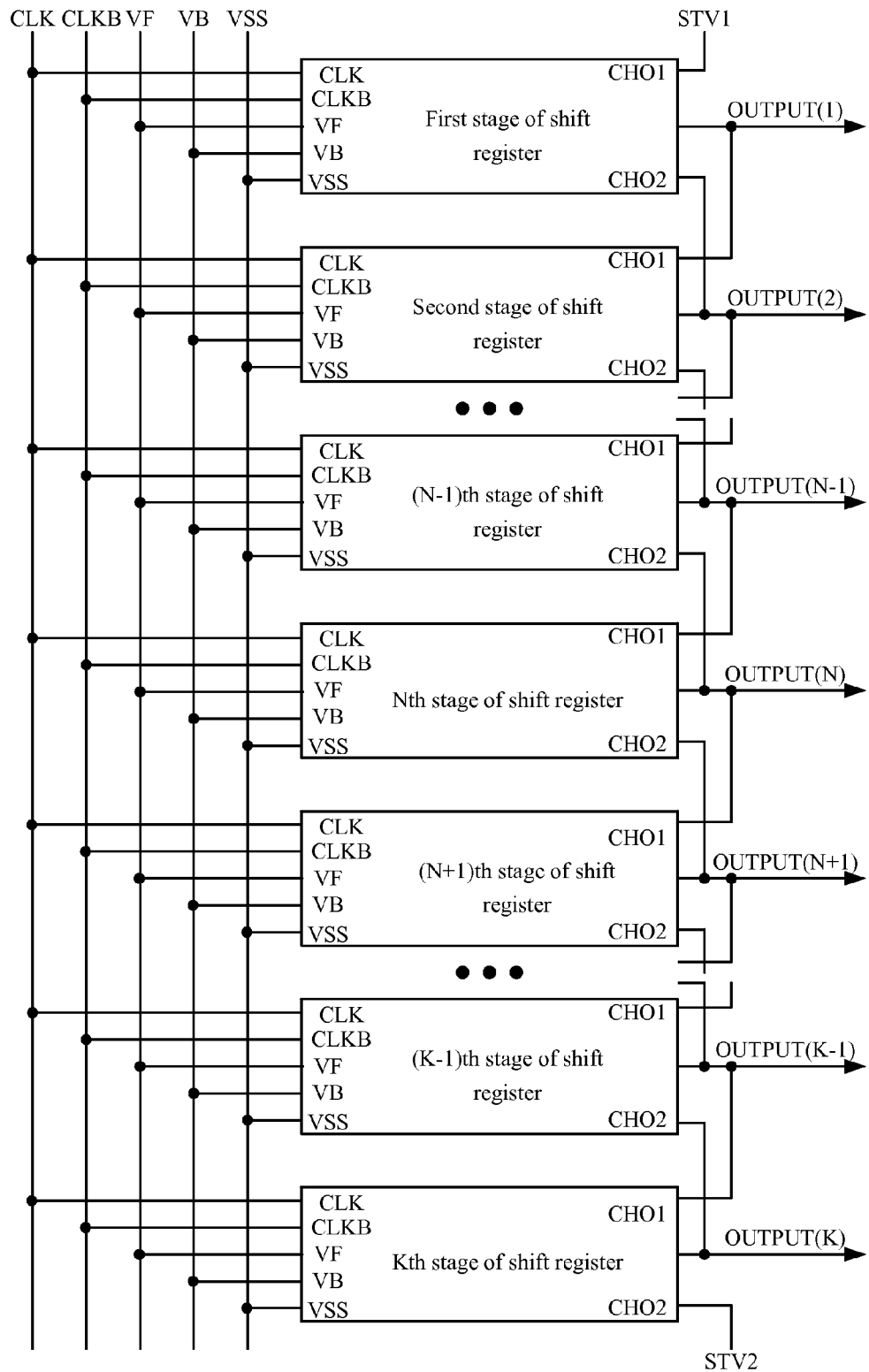
FIG. 13 is a schematic structure diagram of a gate driving device provided in the embodiments of the present disclosure.

As shown in FIG. 13, it is assumed that there are K stages of shift registers, in a case in which an Nth stage of shift register belongs to a shift register other than the first stage of shift register and the last stage of shift register, the first selection signal CHO1 received by the Nth stage of shift register is the signal output from the control signal output terminal OUTPUT(N−1) of an (N−1)th stage of shift register, the second selection signal CHO2 received by the Nth stage of shift register is the signal output from the control signal output terminal OUTPUT(N+1) of an (N+1)th stage of shift register; in a case in which the Nth stage of shift register is the first stage of shift register, the first selection signal CHO1 received by the Nth stage of shift register is the first initial trigger signal STV1, the second selection signal CHO2 received by the Nth stage of shift register is the signal output from the control signal output terminal OUTPUT(2) of a second stage of shift register; in a case in which the Nth stage of shift register is the last stage of shift register, the first selection signal CHO1 received by the Nth stage of shift register is the signal output from the control signal output terminal OUTPUT(K−1) of a (K−1)th stage of shift register, the second selection signal CHO2 received by the Nth stage of shift register is the second initial trigger signal STV2. Furthermore, in FIG. 13, there are a clock signal CLK, a clock block signal CLKB, a forward scan signal VF, a reverse scan signal VB and a low level signal VSS.

In the embodiments of the present disclosure, there is further provided a liquid crystal display device including the gate driving device provided in the embodiments of the present disclosure.

The above sequence numbers in the above embodiments of the present disclosure are just for illustration, and do not represent the performances of the embodiments.

It will be obvious that those skilled in the art may make modifications, variations and equivalences to the above embodiments without departing from the spirit and scope of the present disclosure as defined by the following claims. Such variations and modifications are intended to be included within the spirit and scope of the present disclosure.

What is claimed is:

1. A shift register, comprising a driving module, an output module, a first pull-down module and a second pull-down module;

wherein the driving module is connected to the output module; the first pull-down module is connected to the driving module, the output module and a second level signal input terminal; the second pull-down module is connected to the driving module, the output module and the second level signal input terminal;

wherein a connection point of the driving module, the output module, the first pull-down module and the second pull-down module is a pull-up node, a connection point of the first pull-down module and the driving module is a first pull-down node, a connection point of the first pull-down module and the output module is a control signal output terminal of the shift register; a connection point of the second pull-down module and the driving module is a second pull-down node, and a connection point of the second pull-down module and the output module is the control signal output terminal of the shift register;

wherein the driving module is configured to control the pull-up node to be at a first level and control the first pull-down node and the second pull-down node to be at a second level when a selection signal received is at the first level or changed from the first level to the second level, and to control a signal at the first pull-down node to be same as a clock signal and control a signal at the second pull-down node to be same as a clock block signal when the pull-up node is at the second level;

the output module is configured to connect the control signal output terminal of the shift register and a clock signal input terminal under the control of the signal at the pull-up node;

the first pull-down module is configured to connect the pull-up node and the second level signal input terminal and connect the control signal output terminal of the shift register and the second level signal input terminal when the signal at the first pull-down node is at the first level;

the second pull-down module is configured to connect the pull-up node and the second level signal input terminal and connect the control signal output terminal of the shift register and the second level signal input terminal when the signal at the second pull-down node is at the first level.

2. The shift register of claim 1, wherein the first pull-down module comprises a first transistor (M1) and a second transistor (M2);

a gate of the first transistor (M1) is connected to the first pull-down node, a first electrode of the first transistor (M1) is connected to the pull-up node, and a second electrode of the first transistor (M1) is connected to the second level signal input terminal;

a gate of the second transistor (M2) is connected to the first pull-down node, a first electrode of the second transistor (M2) is connected to the control signal output terminal of the shift register, and a second electrode of the second transistor (M2) is connected to the second level signal input terminal;

the first transistor (M1) is configured to be turned on when the signal at the first pull-down node is at the first level so as to connect the pull-up node and the second level signal input terminal, the second transistor (M2) is configured to be turned on when the signal at the first pull-down node is at the first level so as to connect the control signal output terminal of the shift register and the second level signal input terminal.

3. The shift register of claim 1, wherein the second pull-down module comprises a third transistor (M3) and a fourth transistor (M4);

a gate of the third transistor (M3) is connected to the second pull-down node, a first electrode of the third transistor (M3) is connected to the pull-up node, and a second electrode of the third transistor (M3) is connected to the second level signal input terminal;

a gate of the fourth transistor (M4) is connected to the second pull-down node, a first electrode of the fourth transistor (M4) is connected to the control signal output terminal of the shift register, and a second electrode of the fourth transistor (M4) is connected to the second level signal input terminal;

the third transistor (M3) is configured to connect the pull-up node and the second level signal input terminal when the signal at the second pull-down node is at the first level; the fourth transistor (M4) is configured to connect the control signal output terminal of the shift register and the second level signal input terminal when the signal at the second pull-down node is at the first level.

4. The shift register of claim 1, wherein, the driving module comprises a pull-up driving module and a pull-down driving module;

the pull-up driving module is configured to control the pull-up node to be at the first level and outputting the signal at first level to the pull-down driving module when the selection signal received is at the first level; and to control the pull-up node to be at the first level and outputting the signal at the second level to the pull-down driving module when the selection signal received is changed from the first level to the second level;

the pull-down driving module is configured to control the signal at the first pull-down node and the signal at the second pull-down node to be at the second level when the pull-up node is at the first level and the signal at the first level output from the pull-up driving module is received, and to control the signal at the first pull-down node and the signal at the second pull-down node to be at the second level when the pull-up node is at the first level and the signal at the second level output from the pull-up driving module is received; and to control the signal at the first pull-down node to be at the second level and the signal at the second pull-down node to be at the first level when the signal at the pull-up node is at the second level, the clock signal received is at the second level and the clock block signal is at the first level, and to control the signal at the first pull-down node to be at the first level and the signal at the second pull-down node to be at the second level when the signal at the pull-up node is at the second level, the clock signal received is at the first level and the clock block signal is at the second level.

5. The shift register of claim 4, wherein, the shift register is a bi-directional scanning shift register, the pull-up driving module comprises a forward scan pull-up driving unit and a reverse scan pull-up driving unit, the forward scan pull-up driving unit is configured to control the pull-up node to be at the first level and output the signal at the first level to the pull-down driving module when a forward scan signal received is at the first level and a first selection signal received is at the first level; and to control the pull-up node to be at the first level and output the signal at the second level to the pull-down driving module when the forward scan signal received is at the first level and the first selection signal received is changed from the first level to the second level;

the reverse scan pull-up driving unit is configured to control the pull-up node to be at the first level and output the signal at the first level to the pull-down driving module when a reverse scan signal received is at the first level and a second selection signal received is at the first level; and to control the pull-up node to be at the first level and output the signal at the second level to the pull-down driving module when the reverse scan signal received is at the first level and the second selection signal received is changed from the first level to the second level.

6. The shift register of claim 4, wherein, the pull-down driving module comprises a first pull-down driving unit and a second pull-down driving unit;

the first pull-down driving unit is configured to connect the first pull-down node and the second level signal input terminal when the signal at the pull-up node is at the first level; and to control the signal at the first pull-down node to be at the second level when the signal at the pull-up node is at the second level, the clock signal received is at the second level and the clock block signal is at the first level, and to control the signal at the first pull-down node to be at the first level when the signal at the pull-up node is at the second level, the clock signal received is at the first level and the clock block signal is at the second level;

the second pull-down driving unit is configured to connect the second pull-down node and the second level signal input terminal when the signal at the first level output from the pull-up driving module is received; and to control the signal at the second pull-down node to be at the first level when the signal at the second level output from the pull-up driving module and when the clock signal received is at the second level and the clock block signal is at the first level; and to control the signal at the second pull-down node to be at the second level when the signal at the second level output from the pull-up driving module is received and when the clock signal received is at the first level and the clock block signal is at the second level.

7. The shift register of claim 5, wherein, the forward scan pull-up driving unit comprises a fifth transistor (M5) and a sixth transistor (M6);

a gate of the fifth transistor (M5) is configured to receive the first selection signal, a first electrode of the fifth transistor (M5) is configured to receive the forward scan signal, and a second electrode of the fifth transistor (M5) is connected to the pull-up node;

a first electrode of the sixth transistor (M6) is configured to receive the first selection signal, a gate of the sixth transistor (M6) is configured to receive the forward scan signal, and a second electrode of the sixth transistor (M6) is configured to output a signal to the pull-down driving module;

the fifth transistor (M5) is configured to control the signal at the pull-up node to be same as the forward scan signal when the first selection signal received is at the first level; the sixth transistor (M6) is configured to control the second electrode of the sixth transistor (M6) to output a signal same as the first selection signal to the pull-down driving module when the forward scan signal received is at the first level.

8. The shift register of claim 5, wherein the reverse scan pull-up driving unit comprises a seventh transistor (M7) and an eighth transistor (M8);

a gate of the seventh transistor (M7) is configured to receive the second selection signal, a first electrode of the seventh transistor (M7) is configured to receive the reverse scan signal, and a second electrode of the seventh transistor (M7) is connected to the pull-up node;

a first electrode of the eighth transistor (M8) is configured to receive the second selection signal, a gate of the eighth transistor (M8) is configured to receive the reverse scan signal, and a second electrode of the eighth transistor (M8) is configured to output a signal to the pull-down driving module;

the seventh transistor (M7) is configured to control the signal at the pull-up node to be same as the reverse scan signal when the second selection signal received is at the first level; the eighth transistor (M8) is configured to control the second electrode of the eighth transistor (M8) to output a signal same as the second selection signal when the reverse scan signal received is at the first level.

9. The shift register of claim 6, wherein the first pull-down driving unit comprises a ninth transistor (M9), a tenth transistor (M10) and an eleventh transistor (M11);
a gate of the ninth transistor (M9) is configured to receive the clock signal, a first electrode of the ninth transistor (M9) is configured to receive the clock signal, a second electrode of the ninth transistor (M9) is connected to the first pull-down node;
a gate of the tenth transistor (M10) is configured to receive the clock block signal, a first electrode of the tenth transistor (M10) is configured to receive the clock signal, and a second electrode of the tenth transistor (M10) is connected to the first pull-down node;
a gate of the eleventh transistor (M11) is connected to the pull-up node, a first electrode of the eleventh transistor (M11) is connected to the first pull-down node, and a second electrode of the eleventh transistor (M11) is connected to the second level signal input terminal; a ratio between the size of the ninth transistor (M9) and the size of the eleventh transistor (M11) is a first preset ratio;
the ninth transistor (M9) is configured to be turned on when the clock signal received is at the first level, and to be turned off when the clock signal received is at the second level;
the tenth transistor (M10) is configured to be turned on when the clock block signal received is at the first level, and to be turned off when the clock block signal received is at the second level;
the eleventh transistor (M11) is configured to be turned on when the signal at the pull-up node is at the first level so as to connect the first pull-down node and the second level signal input terminal; and is configured to be turned off when the signal at the pull-up node is at the second level so as to disconnect the first pull-down node from the second level signal input terminal.

10. The shift register of claim 9, wherein the first preset ratio is configured to ensure that the signal at the first pull-down node is at the second level during the time period in which the ninth transistor (M9) and the eleventh transistor (M11) are both turned on.

11. The shift register of claim 6, wherein the second pull-down driving unit comprises a twelfth transistor (M12), a thirteenth transistor (M13) and a fourteenth transistor (M14);
a gate of the twelfth transistor (M12) is configured to receive the clock signal, a first electrode of the twelfth transistor (M12) is configured to receive the clock block signal, a second electrode of the twelfth transistor (M12) is connected to the second pull-down node;
a gate of the thirteenth transistor (M13) is configured to receive the clock block signal, a first electrode of the thirteenth transistor (M13) is configured to receive the clock block signal, and a second electrode of the thirteenth transistor (M13) is connected to the second pull-down node;
a gate of the fourteenth transistor (M14) is configured to receive the signal output from the pull-up driving module, a first electrode of the fourteenth transistor (M14) is connected to the second pull-down node, and a second electrode of the fourteenth transistor (M14) is connected to the second level signal input terminal; a ratio between the size of the thirteenth transistor (M13) and the size of the fourteenth transistor (M14) is a second preset ratio;
the twelfth transistor (M12) is configured to be turned on when the clock signal received is at the first level, and is configured to be turned off when the clock signal received is at the second level;
the thirteenth transistor (M13) is configured to be turned on when the clock block signal received is at the first level, and is configured to be turned off when the clock block signal received is at the second level;
the fourteenth transistor (M14) is configured to connect the second pull-down node and the second level signal input terminal when the signal received which is output from the pull-up driving module is at the first level; and to disconnect the second pull-down node from the second level signal input terminal when the signal received which is output from the pull-up driving module is at the second level.

12. The shift register of claim 11, wherein the second preset ratio is configured to ensure that the signal at the second pull-down node is at the second level during the time period in which the thirteenth transistor (M13) and the fourteenth transistor (M14) are both turned on.

13. The shift register of claim 1, wherein the output module comprises a fifteenth transistor (M15) and a capacitor (C1);
a gate of the fifteenth transistor (M15) is connected to the pull-up node, a first electrode of the fifteenth transistor (M15) is configured to receive the clock signal, a second electrode of the fifteenth transistor (M15) serves as the control signal output terminal of the shift register;
one terminal of the capacitor (C1) is connected to the pull-up node, and the other terminal of the capacitor (C1) is connected to the second electrode of the fifteenth transistor (M15);
the fifteenth transistor (M15) is configured to output the received clock signal via the control signal output terminal of the shift register when the signal at the pull-up node is at the first level; and is configured to be turned off when the signal at the pull-up node is at the second level;
the capacitor (C1) is configured to store the signal at the pull-up node.

14. A gate driving device, comprising a plurality of stages of shift registers of claim 5; except a first stage of shift register and a last stage of shift register, each stage of shift register is configured to receive a control signal output from a previous stage of shift register as a first selection signal and is configured to receive a control signal output from a next stage of shift register as a second selection signal; the first stage of shift register is configured to receive a first initial trigger signal as a first selection signal and is configured to receive a control signal output from a second stage of shift register as a second selection signal; the last stage of shift register is configured to receive a second initial trigger signal as a second selection signal and is configured to receive a control signal output from a previous stage of shift register as a first selection signal.

15. A liquid crystal display device, comprising the gate driving device of claim 14.

16. The gate driving device of claim 14, wherein, the pull-down driving module comprises a first pull-down driving unit and a second pull-down driving unit;
the first pull-down driving unit is configured to connect the first pull-down node and the second level signal input terminal when the signal at the pull-up node is at the first level; and to control the signal at the first pull-down node to be at the second level when the signal at the pull-up node is at the second level, the clock signal received is at the second level and the clock block signal is at the first level, and to control the signal at the first pull-down node to be at the first level when the signal at the pull-up node is at the second level, the clock signal received is at the first level and the clock block signal is at the second level;

the second pull-down driving unit is configured to connect the second pull-down node and the second level signal input terminal when the signal at the first level output from the pull-up driving module is received; and to control the signal at the second pull-down node to be at the first level when the signal at the second level output from the pull-up driving module and when the clock signal received is at the second level and the clock block signal is at the first level; and to control the signal at the second pull-down node to be at the second level when the signal at the second level output from the pull-up driving module is received and when the clock signal received is at the first level and the clock block signal is at the second level.

17. The gate driving device of claim 14, wherein, the forward scan pull-up driving unit comprises a fifth transistor (M5) and a sixth transistor (M6);
a gate of the fifth transistor (M5) is configured to receive the first selection signal, a first electrode of the fifth transistor (M5) is configured to receive the forward scan signal, and a second electrode of the fifth transistor (M5) is connected to the pull-up node;
a first electrode of the sixth transistor (M6) is configured to receive the first selection signal, a gate of the sixth transistor (M6) is configured to receive the forward scan signal, and a second electrode of the sixth transistor (M6) is configured to output a signal to the pull-down driving module;
the fifth transistor (M5) is configured to control the signal at the pull-up node to be same as the forward scan signal when the first selection signal received is at the first level; the sixth transistor (M6) is configured to control the second electrode of the sixth transistor (M6) to output a signal same as the first selection signal to the pull-down driving module when the forward scan signal received is at the first level.

18. The gate driving device of claim 14, wherein the reverse scan pull-up driving unit comprises a seventh transistor (M7) and an eighth transistor (M8);
a gate of the seventh transistor (M7) is configured to receive the second selection signal, a first electrode of the seventh transistor (M7) is configured to receive the reverse scan signal, and a second electrode of the seventh transistor (M7) is connected to the pull-up node;
a first electrode of the eighth transistor (M8) is configured to receive the second selection signal, a gate of the eighth transistor (M8) is configured to receive the reverse scan signal, and a second electrode of the eighth transistor (M8) is configured to output a signal to the pull-down driving module;
the seventh transistor (M7) is configured to control the signal at the pull-up node to be same as the reverse scan signal when the second selection signal received is at the first level; the eighth transistor (M8) is configured to control the second electrode of the eighth transistor (M8) to output a signal same as the second selection signal when the reverse scan signal received is at the first level.

19. The gate driving device of claim 16, wherein the first pull-down driving unit comprises a ninth transistor (M9), a tenth transistor (M10) and an eleventh transistor (M11);
a gate of the ninth transistor (M9) is configured to receive the clock signal, a first electrode of the ninth transistor (M9) is configured to receive the clock signal, a second electrode of the ninth transistor (M9) is connected to the first pull-down node;
a gate of the tenth transistor (M10) is configured to receive the clock block signal, a first electrode of the tenth transistor (M10) is configured to receive the clock signal, and a second electrode of the tenth transistor (M10) is connected to the first pull-down node;
a gate of the eleventh transistor (M11) is connected to the pull-up node, a first electrode of the eleventh transistor (M11) is connected to the first pull-down node, and a second electrode of the eleventh transistor (M11) is connected to the second level signal input terminal; a ratio between the size of the ninth transistor (M9) and the size of the eleventh transistor (M11) is a first preset ratio;
the ninth transistor (M9) is configured to be turned on when the clock signal received is at the first level, and to be turned off when the clock signal received is at the second level;
the tenth transistor (M10) is configured to be turned on when the clock block signal received is at the first level, and to be turned off when the clock block signal received is at the second level;
the eleventh transistor (M11) is configured to be turned on when the signal at the pull-up node is at the first level so as to connect the first pull-down node and the second level signal input terminal; and is configured to be turned off when the signal at the pull-up node is at the second level so as to disconnect the first pull-down node from the second level signal input terminal.

20. The gate driving device of claim 16, wherein the second pull-down driving unit comprises a twelfth transistor (M12), a thirteenth transistor (M13) and a fourteenth transistor (M14);
a gate of the twelfth transistor (M12) is configured to receive the clock signal, a first electrode of the twelfth transistor (M12) is configured to receive the clock block signal, a second electrode of the twelfth transistor (M12) is connected to the second pull-down node;
a gate of the thirteenth transistor (M13) is configured to receive the clock block signal, a first electrode of the thirteenth transistor (M13) is configured to receive the clock block signal, and a second electrode of the thirteenth transistor (M13) is connected to the second pull-down node;
a gate of the fourteenth transistor (M14) is configured to receive the signal output from the pull-up driving module, a first electrode of the fourteenth transistor (M14) is connected to the second pull-down node, and a second electrode of the fourteenth transistor (M14) is connected to the second level signal input terminal; a ratio between the size of the thirteenth transistor (M13) and the size of the fourteenth transistor (M14) is a second preset ratio;
the twelfth transistor (M12) is configured to be turned on when the clock signal received is at the first level, and is configured to be turned off when the clock signal received is at the second level;
the thirteenth transistor (M13) is configured to be turned on when the clock block signal received is at the first level, and is configured to be turned off when the clock block signal received is at the second level;

the fourteenth transistor (M14) is configured to connect the second pull-down node and the second level signal input terminal when the signal received which is output from the pull-up driving module is at the first level; and to disconnect the second pull-down node from the second level signal input terminal when the signal received which is output from the pull-up driving module is at the second level.

* * * * *